United States Patent

Weber et al.

[11] Patent Number: 5,929,698
[45] Date of Patent: Jul. 27, 1999

[54] FILTER CIRCUIT ARRANGEMENT

[75] Inventors: Stephan Weber; Volker Thomas, both of Munich, Germany

[73] Assignee: Siemens Aktiengesellschaft, Munich, Germany

[21] Appl. No.: 08/889,850

[22] Filed: Jul. 8, 1997

[30] Foreign Application Priority Data

Jul. 12, 1996 [DE] Germany .......................... 196 28 255

[51] Int. Cl.⁶ .................................................. H03K 5/00
[52] U.S. Cl. .......................... 327/552; 327/558; 327/344; 333/172; 330/109
[58] Field of Search ..................................... 327/552, 553, 327/558, 311, 336, 344; 333/172; 330/303, 109

[56] References Cited

U.S. PATENT DOCUMENTS 4,110,692  8/1978  Pradal ........................................ 327/311
5,740,716  4/1998  Stilson ....................................... 384/661

FOREIGN PATENT DOCUMENTS 7-283690  10/1995  Japan .

OTHER PUBLICATIONS

Article: U. Tietze, Ch. Schenk, Electronic Circuits —Designs and Applications, Berlin, Heidelburg, 1991, pp. 376–379.

Primary Examiner—Dinh T. Le
Attorney, Agent, or Firm—Hill & Simpson

[57] ABSTRACT

A low-pass filter circuit including a first sub-filter designed in integrated circuit technology. The first sub-filter includes high-impedance resistor elements and smaller capacitances. A second sub-filter preceding the first sub-filter is constructed with low-impedance resistor elements and higher capacitances.

5 Claims, 1 Drawing Sheet

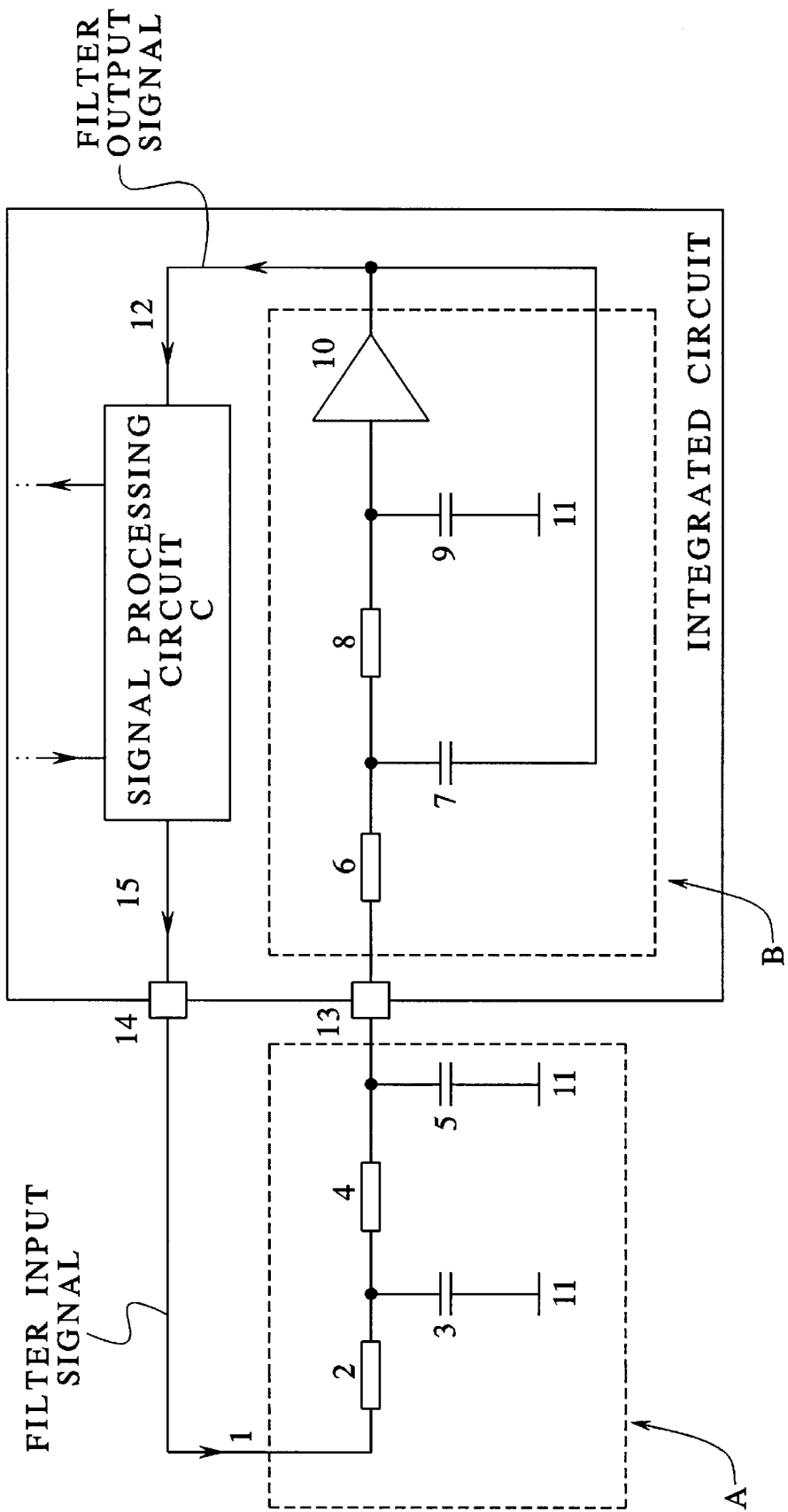

FILTER CIRCUIT ARRANGEMENT

BACKGROUND OF THE INVENTION

The invention is directed to a filter circuit. In particular, the invention relates to low-pass filter circuits for applications in integrated circuit technology.

Filter circuits of a higher order are often required in conjunction with integrated circuits, as known, for example, from U. Tietze, Ch. Schenk, Electronic Circuits—Designs and Applications, Berlin, Heidelberg, 1991, pages 376–379. Such filter circuits cascade a number of sub-filters of the first or second order. The sub-filters are designed as individual active filters. The filters should conform to strict tolerance demands. It is difficult to achieve the strict tolerance levels in cascaded filters which have been combined using standard integration techniques. In addition, design problems occur in filter circuit applications for low frequencies because a significant portion of the chip area is used to incorporate the high capacitances and resistances which are needed.

A further disadvantage of these filter circuits occurs when high-impedance resistors are used. In addition to strict tolerance demands, bias currents are always present and may affect the circuit arrangement even more significantly than undesired offset voltages. Due to the need for precise filters with large time constants, filter circuit design technology has had to resort to external resistors and capacitors in conjunction with integrated amplifiers. Difficulty in these filter circuit designs occurs, especially in applications involving filters of a higher order where numerous terminal pins are required. Also, problems may occur because the offset voltages from the individual amplifiers correspondingly increase.

SUMMARY OF THE INVENTION

An object of the invention is to specify an improved filter circuit that can be designed within tight tolerance demands.

Another object of the invention is to design filter circuits for low frequency applications that do not require a large chip surface area.

Another object of the invention is to reduce circuit damage caused by bias currents and to enhance the performance of the circuit components.

Another object of the invention is to minimize offset voltages.

These objects are achieved by a filter circuit arrangement that incorporates a sub-filter designed in integrated circuit technology and external to the integrated circuit. A first sub-filter is designed externally to the integrated circuit and precedes a second sub-filter. The first sub-filter includes low-impedance resistor elements and large capacitance elements. A second sub-filter includes high-impedance resistance elements and small capacitance elements.

The invention is explained in greater detail below with reference to the exemplary embodiment shown in the drawing below.

BRIEF DESCRIPTION OF THE DRAWING

FIG. 1 is a schematic diagram of the inventive filter circuit arrangement.

DETAILED DESCRIPTION OF THE PREFERRED EMBODIMENT

The circuit arrangement shown in FIG. 1 is an exemplary embodiment of a low-pass filter of the fourth order for low frequency applications. The invention may also be applied in other order filters. Such a circuit arrangement may be used in applications for filtering out a Direct Current (DC) component from an input signal 1. The filter circuit is composed of two sub-filters A and B. Sub-filter B is designed entirely in integrated circuit technology, and the sub-filter A is designed with discrete components external to the integrated circuit.

The sub-filter A incorporates two low-pass filters (or RC circuits) of the first order connected in series to one another. A first low-pass filter includes a resistor 2 and a capacitor 3. A second low-pass filter includes a resistor 4 and a capacitor 5. Sub-filter A is designed so that the resistor 2 is substantially lower in impedance than the resistor 4 and the capacitance of the capacitor 3 is significantly higher than the capacitance of capacitor 5. Both capacitors 3 and 5 are connected to ground 11. An input signal 1 located at a terminal pin 14 is carried to the input of the first low-pass filter 2,3. As the input signal 1 passes through the first low-pass filter, unwanted signals having higher frequencies are filtered out. The first low-pass filter 2,3 is coupled to the second low-pass filter 4,5 to further eliminate unwanted signals. The remaining signal outputted from the second low-pass filter 4,5 is carried to the integrated circuit via a terminal pin 13.

An integrated circuit 15 contains sub-filter B. Terminal pin 13 inputs the signal to internal sub-filter B. Sub-filter B consists of two filter circuits (or RC circuits) 6,7 and 8,9 and an amplifier 10. The resistors 6 and 8 are substantially higher in impedance in comparison to the resistor 4. As such, the capacitances of the capacitors 7,9 are considerably lower than the capacitance of capacitor 5. The impedance of resistors 2,4,6,8 in the inventive circuit arrangement increases such that the ratio between the resistor 2 and the resistor 4 is 1:10 and the ratio between the resistors 6,8 and the resistor 4 is also 1:10.

The output of filter circuit 8,9 is connected to the input of the amplifier 10. The output from amplifier 10 and capacitor 7 creates an internal signal 12 that is inputted to a signal processing circuit C. Internal signal 12 passes through the signal processing circuit components C and creates internal signal 1 at terminal pin 14.

The incorporation of the external sub-filter A in the inventive filter circuit is advantageous because it avoids problems caused by tight tolerance levels involved in integrated circuits. In addition, the incorporation of the external sub-filter A also avoids problems caused by large time constants associated with an integrated filter circuit that has minimal space available on a surface area of a chip and few terminal pins. Due to the specific combination of the external and integrated elements, the inventive filter circuit minimizes offset voltages that can be found in purely external or purely integrated circuits. This is achieved primarily because the low-impedance external elements generate low offset voltages from bias currents. The amplifier 10 also functions to reduce offset voltages. The integrated resistors 6,8 are high impedance in contrast to the external resistors 2,4 and are generally smaller in size and require less surface area of the chip. In addition, the integrated circuit is designed to load the external sub-filter A at a lower level. The low load on the external sub-filter A is beneficial because the quality of the external sub-filter A remains preserved and the life of the circuit components are extended.

Finally, the passive design of the external sub-filter A requires only a slight number of additional terminal pins. For example, in the inventive embodiment shown in FIG. 1, only two additional terminal pins are required.

Although the present invention has been described with reference to a specific embodiment, those of skill in the art will recognize that changes may be made thereto without departing from the scope and spirit of the invention as set forth in the appended claims.

We claim:

1. A filter circuit arrangement for filtering DC components from an input signal of a signal processing circuit having an input terminal for receiving said input signal and an output terminal for outputting an output signal, the filter circuit arrangement comprising:

an external filter including an input terminal for receiving said input signal from said signal processing circuit, an output terminal and a first plurality of RC circuits connected in series; and a sub-filter including a sub-filter input terminal coupled to said output terminal of said external filter, a sub-filter output terminal coupled to said output terminal of said signal processing circuit, a second plurality of RC circuits connected in series, and at least one amplifier, said at least one amplifier connected in series with said second plurality of RC circuits;

wherein said signal processing circuit and said sub-filter being incorporated in a monolithic integrated circuit and impedances of said second plurality of RC circuits are selected to be higher than impedances of said first plurality of RC circuits to avoid problems caused by large time constants associated with said sub-filter so that a surface area of the integrated circuit is minimal.

2. The filter circuit of claim 1, wherein at least one resistor of said plurality of said RC circuits of said sub-filter having a resistance that is greater than the resistance of each resistor of said plurality of RC circuits of said external filter.

3. The filter circuit of claim 2, wherein a resistance of at least one of said resistors of said second plurality of said RC circuits of said sub-filter is ten times greater than the resistance of each resistor of said first plurality of said RC circuits of said external filter.

4. The filter circuit of claim 1, wherein at least one of said capacitors of said first plurality of said RC circuits of said external filter has a capacitance that is greater than the capacitance of each of said capacitors of said second plurality of said RC circuits of said sub-filter.

5. The filter circuit of claim 4, wherein at least one of said capacitors of said first plurality of said RC circuits of said external filter has a capacitance that is ten times greater than the capacitance of each of said capacitors of said second plurality of said RC circuits of said sub-filter.

* * * * *